(12) United States Patent
Schieck et al.

(10) Patent No.: US 8,951,814 B2
(45) Date of Patent: Feb. 10, 2015

(54) METHOD OF FABRICATING A FLIP CHIP SEMICONDUCTOR DIE WITH INTERNAL SIGNAL ACCESS

(71) Applicant: NVIDIA Corporation, Santa Clara, CA (US)

(72) Inventors: Brian S. Schieck, Hayward, CA (US); Howard Lee Marks, Gilroy, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/747,386

(22) Filed: Jan. 22, 2013

(65) Prior Publication Data

US 2013/0221354 A1  Aug. 29, 2013

Related U.S. Application Data

(60) Continuation of application No. 12/005,716, filed on Dec. 28, 2007, now Pat. No. 8,357,931, which is a division of application No. 10/789,637, filed on Feb. 27, 2004, now Pat. No. 7,842,948.

(51) Int. Cl.
G01R 31/26 (2014.01)
H01L 21/66 (2006.01)
G01R 31/28 (2006.01)

(52) U.S. Cl.
CPC .............. *H01L 22/30* (2013.01); *H01L 22/32* (2013.01); *H01L 22/10* (2013.01); *G01R 31/2884* (2013.01); *Y10S 438/94* (2013.01)
USPC ............ 438/18; 438/625; 438/637; 438/641; 438/676; 438/940; 257/48; 257/690; 257/737; 257/781; 257/E23.002

(58) Field of Classification Search
None
See application file for complete search history.

(56) References Cited

U.S. PATENT DOCUMENTS

| 2,795,755 | A | 6/1957 | Anthes et al. |
| 3,870,953 | A | 3/1975 | Boatman et al. |
| 4,700,293 | A | 10/1987 | Grone |
| 5,247,689 | A | 9/1993 | Ewert |
| 5,257,223 | A | 10/1993 | Dervisoglu |
| 5,258,648 | A | 11/1993 | Lin |

(Continued)

FOREIGN PATENT DOCUMENTS

DE   19515591   10/1995

OTHER PUBLICATIONS

"S. Chakravarthy and V. P. Dabholkar", "Two Techniques for Minimizing Power Dissipation in Scan Circuits During Test Application", Proceedings of the third Asian Test Symposium, Date: Nov. 1994, pp. 324-329.

(Continued)

*Primary Examiner* — Zandra Smith
*Assistant Examiner* — Khanh Duong

(57) ABSTRACT

A device and method for providing access to a signal of a flip chip semiconductor die. A hole is bored into a semiconductor die to a test probe point. The hole is backfilled with a conductive material, electrically coupling the test probe point to a signal redistribution layer. A conductive bump of the signal redistribution layer is electrically coupled to a conductive contact of a package substrate. An external access point of the package substrate is electrically coupled to the conductive contact, such that signals of the flip chip semiconductor die are accessible for measurement at the external access point.

17 Claims, 6 Drawing Sheets

(56) References Cited

U.S. PATENT DOCUMENTS

| | | | |
|---|---|---|---|
| 5,258,658 A | 11/1993 | Morikawa | |
| 5,262,719 A | 11/1993 | Magdo | |
| 5,409,568 A | 4/1995 | Vasche | |
| 5,428,622 A | 6/1995 | Kuban et al. | |
| 5,499,248 A | 3/1996 | Behrens et al. | |
| 5,579,510 A | 11/1996 | Wang et al. | |
| 5,629,240 A * | 5/1997 | Malladi et al. | 438/106 |
| 5,635,718 A | 6/1997 | DePuydt et al. | |
| 5,753,529 A | 5/1998 | Chang et al. | |
| 5,757,081 A | 5/1998 | Chang et al. | |
| 5,767,578 A | 6/1998 | Chang et al. | |
| 5,807,763 A * | 9/1998 | Motika et al. | 438/18 |
| 5,818,252 A | 10/1998 | Fullman et al. | |
| 5,834,844 A | 11/1998 | Akagawa et al. | |
| 5,880,592 A | 3/1999 | Sharpes et al. | |
| 5,907,562 A | 5/1999 | Wrape et al. | |
| 5,913,034 A | 6/1999 | Malcolm | |
| 5,966,021 A | 10/1999 | Eliashberg et al. | |
| 5,988,485 A | 11/1999 | Master et al. | |
| 5,996,099 A | 11/1999 | Fournel et al. | |
| 6,011,748 A | 1/2000 | Lepejian et al. | |
| 6,049,900 A | 4/2000 | Fournel et al. | |
| 6,056,784 A | 5/2000 | Stanion | |
| 6,057,698 A | 5/2000 | Heo et al. | |
| 6,075,427 A * | 6/2000 | Tai et al. | 333/219 |
| 6,081,429 A | 6/2000 | Barrett | |
| 6,085,346 A | 7/2000 | Lepejian et al. | |
| 6,097,087 A | 8/2000 | Farnworth et al. | |
| 6,103,549 A | 8/2000 | Master et al. | |
| 6,114,892 A | 9/2000 | Jin | |
| 6,133,744 A | 10/2000 | Yojima et al. | |
| 6,180,433 B1 * | 1/2001 | Furey et al. | 438/106 |
| 6,246,252 B1 | 6/2001 | Malladi et al. | |
| 6,247,165 B1 | 6/2001 | Wohl et al. | |
| 6,297,654 B1 | 10/2001 | Barabi | |
| 6,307,162 B1 | 10/2001 | Masters et al. | |
| 6,336,212 B1 | 1/2002 | Gray et al. | |
| 6,380,555 B1 | 4/2002 | Hembree et al. | |
| 6,392,432 B1 | 5/2002 | Jaimsomporn et al. | |
| 6,420,888 B1 | 7/2002 | Griffin et al. | |
| 6,429,532 B1 | 8/2002 | Han et al. | |
| 6,472,895 B2 | 10/2002 | Jaimsomporn et al. | |
| 6,472,900 B1 | 10/2002 | Malladi et al. | |
| 6,519,729 B1 | 2/2003 | Whetsel | |
| 6,534,853 B2 | 3/2003 | Liu et al. | |
| 6,581,189 B1 | 6/2003 | Tain | |
| 6,590,294 B1 | 7/2003 | Lee et al. | |
| 6,622,273 B1 | 9/2003 | Barnes | |
| 6,625,784 B1 | 9/2003 | Ohta et al. | |
| 6,686,615 B1 | 2/2004 | Cheng et al. | |
| 6,747,342 B1 | 6/2004 | Planey | |
| 6,750,646 B1 | 6/2004 | Voss et al. | |
| 6,753,253 B1 * | 6/2004 | Takahashi et al. | 438/676 |
| 6,763,488 B2 | 7/2004 | Whetsel | |
| 6,769,080 B2 | 7/2004 | Whetsel | |
| 6,788,105 B2 | 9/2004 | Kono | |
| 6,838,773 B2 * | 1/2005 | Kikuchi et al. | 257/773 |
| 6,856,007 B2 * | 2/2005 | Warner | 257/678 |
| 6,873,927 B2 | 3/2005 | Chi et al. | |
| 6,876,215 B1 | 4/2005 | Hannan et al. | |
| 6,878,172 B2 | 4/2005 | Jensen | |
| 6,884,642 B2 | 4/2005 | Farnworth et al. | |
| 6,914,424 B2 | 7/2005 | Chi et al. | |
| 6,933,524 B2 | 8/2005 | Hembree et al. | |
| 6,990,642 B2 | 1/2006 | Arakawa | |
| 7,020,699 B2 | 3/2006 | Zhang et al. | |
| 7,051,257 B2 | 5/2006 | Whetsel | |
| 7,122,885 B2 | 10/2006 | Planey | |
| 7,216,050 B1 | 5/2007 | Bachman et al. | |
| 7,279,887 B1 | 10/2007 | King et al. | |
| 7,312,528 B2 * | 12/2007 | Watanabe et al. | 257/728 |
| 7,444,569 B2 | 10/2008 | Shidei | |
| 7,495,466 B1 | 2/2009 | Pitkethly et al. | |
| 7,523,369 B2 | 4/2009 | Chang | |
| 7,568,142 B2 | 7/2009 | Whetsel | |
| 7,761,751 B1 | 7/2010 | West | |
| 7,765,443 B1 | 7/2010 | Syed et al. | |
| 7,842,948 B2 | 11/2010 | Schieck et al. | |
| 7,846,782 B2 | 12/2010 | Maxwell et al. | |
| 7,872,492 B2 | 1/2011 | Pitkethly et al. | |
| 8,486,756 B2 | 7/2013 | Masuda et al. | |
| 8,742,796 B2 | 6/2014 | Dally et al. | |
| 8,796,864 B2 | 8/2014 | Masuda et al. | |
| 2001/0006233 A1 | 7/2001 | Vallett | |
| 2001/0010356 A1 | 8/2001 | Talbot et al. | |
| 2003/0023912 A1 | 1/2003 | Lesea | |
| 2003/0101395 A1 | 5/2003 | Man et al. | |
| 2003/0119297 A1 | 6/2003 | Lam et al. | |
| 2003/0120829 A1 | 6/2003 | Avvari et al. | |
| 2003/0124816 A1 | 7/2003 | Potts | |
| 2003/0131717 A1 | 7/2003 | Shiiya | |
| 2004/0015762 A1 | 1/2004 | Klotz et al. | |
| 2005/0055617 A1 | 3/2005 | Wang et al. | |
| 2005/0166110 A1 | 7/2005 | Swanson et al. | |
| 2005/0229058 A1 | 10/2005 | Shidei | |
| 2007/0016834 A1 | 1/2007 | Debnath et al. | |
| 2008/0021669 A1 | 1/2008 | Blancha et al. | |
| 2008/0115005 A1 | 5/2008 | Kamada | |
| 2008/0122463 A1 | 5/2008 | Dabral et al. | |

OTHER PUBLICATIONS

"R. M. Chou, K. K. Saluja and V. D. Agrawal", "Scheduling Test for VLSI Systems Under Power Constraints", IEE Transactions on Very Large Scale Integration Systems, Date: Jun. 1997, pp. 175-185, vol. 5, No. 2.

"S. Gerstendorfer and H.J. Wunderlich", "Minimized Power Consumption for Scan-Based BIST", International Test Conference, Date: Sep. 1999, pp. 77-84.

"Ranganathan Sankaralingam, B.Pouya, and Nur A. Touba", "Reducing Test Power During Test Using Programmable Scan Chain Disable" 19th IEEE Proceedings of the VLSI Test Symposium, Date: Apr. 2001, pp. 319-324.

"V.P.Dabholkar, S.Chakravarthy, I.Pomeranz and S.Reddy", "Techniques for Minimizing Power Dissipation in Scan and Combinational Circuits During Test Application", IEEE Transaction on Computer-Aided Design of Integrated Circuits and Systems, Date: Dec. 1998, pp. 1325-1333, vol. 17, Issue 12.

"S.Wang and S.K.Gupta", "LT-RTPG: A New Test-Per-Scan BIST TPG for Low Heat Dissipation", International Test Conference, Date: Sep. 1999, pp. 85-94.

"Harald Varnken, Tom Waayers, Nerve Fleury and David Lelouvier", "Enhanced Reduced Pincount Testing for Full-Scan Design", Proceedings of the 2001 International Test Conference, Date: 2001, pp. 738-747.

"D. Heidel et al.,", "High Speed Serializing/De-Serializing Design for Test Method for Evaluating a 1Ghz Microprocessor", Proceedings VLSI Test Symposium, Date: IEEE 1998, pp. 234-238.

"Y.Zorian", "Testing the Monster Chip", IEEE Spectrum, Date: Jul. 1999, pp. 1119-1122.

"Saxena .J, Butler Kenneth .M and Whetsel Lee", "An Analysis of Power Reduction Techniques in Scan Testing", Proceedings of International Test Conference, 2001, Date: Oct. 2001, pp. 670-677.

\* cited by examiner

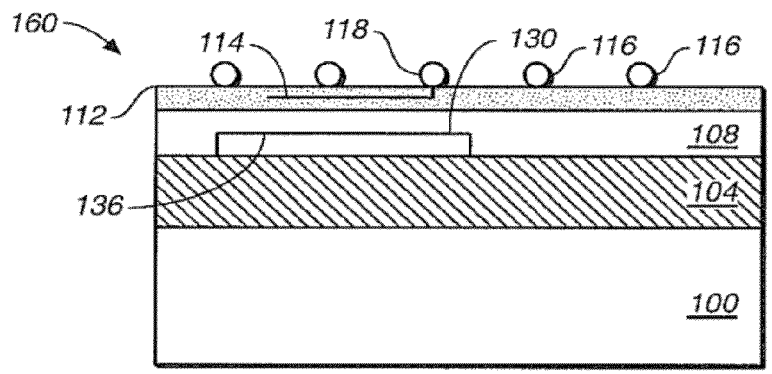
FIG._1A
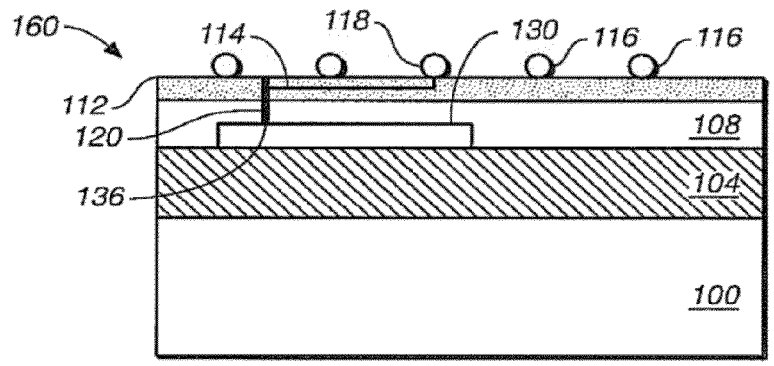
FIG._1B
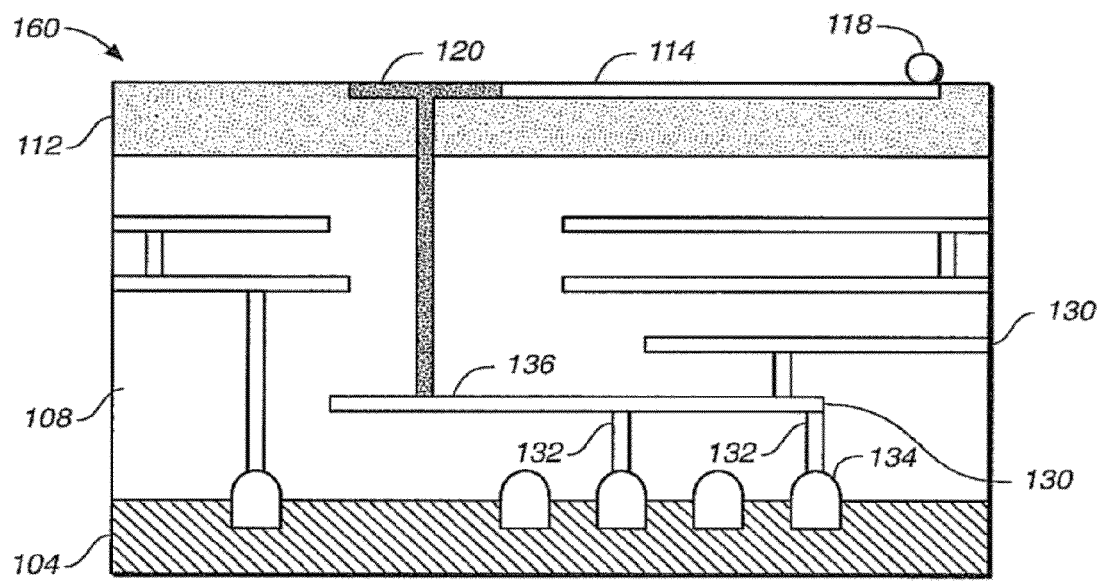
FIG._1C

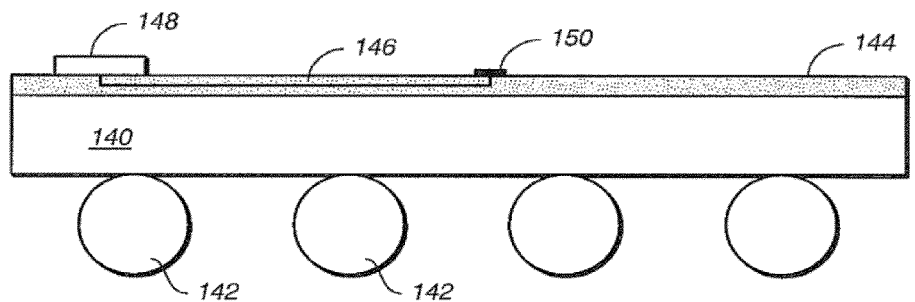
FIG._2A
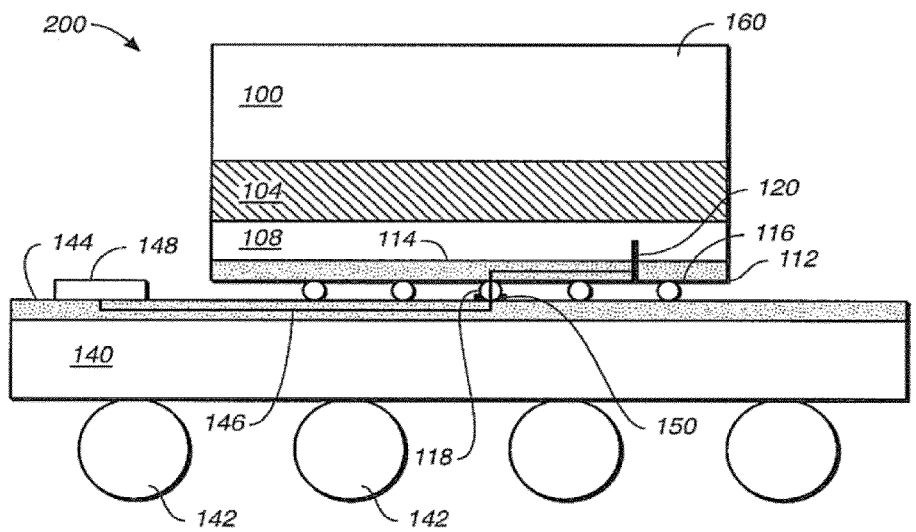
FIG._2B

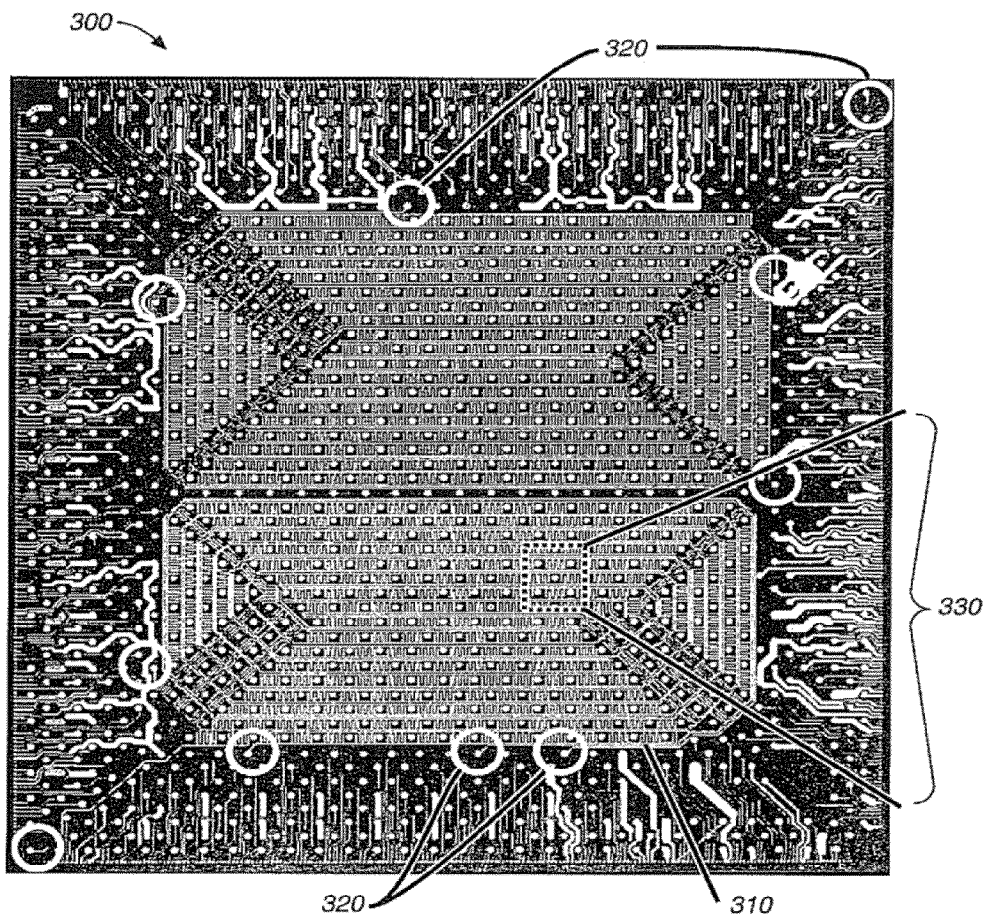
FIG._3A

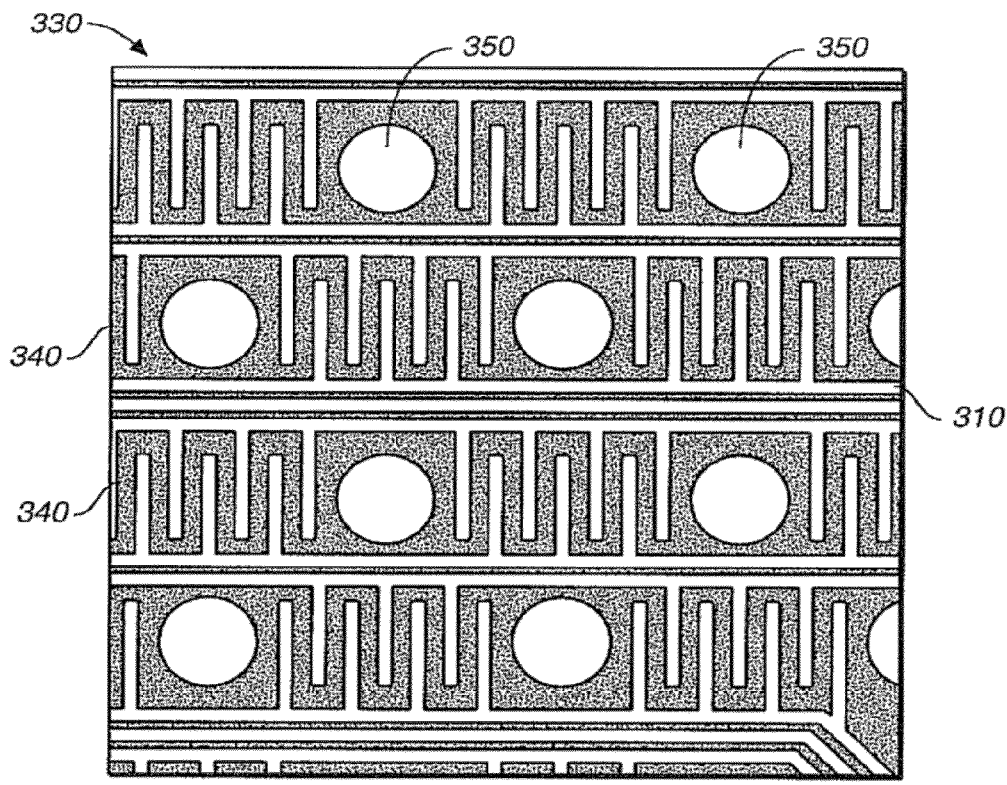
FIG._3B
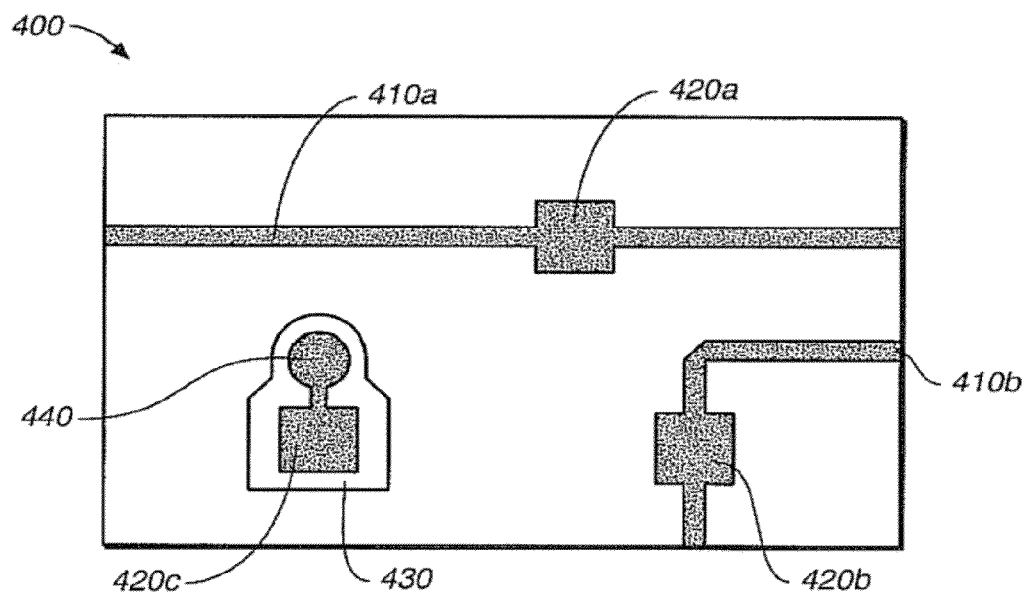
FIG._4

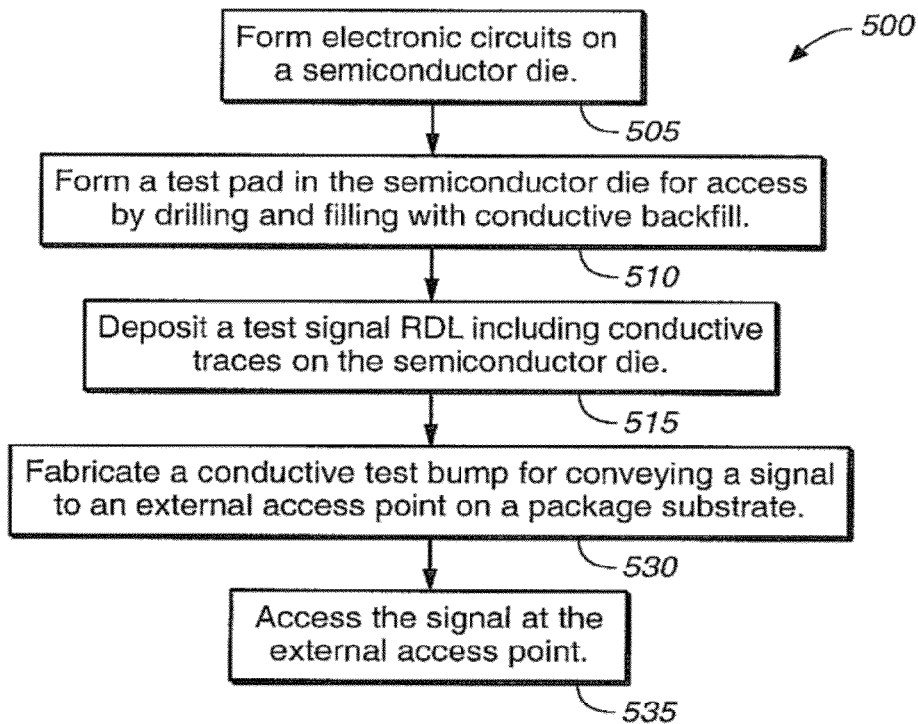
FIG._5
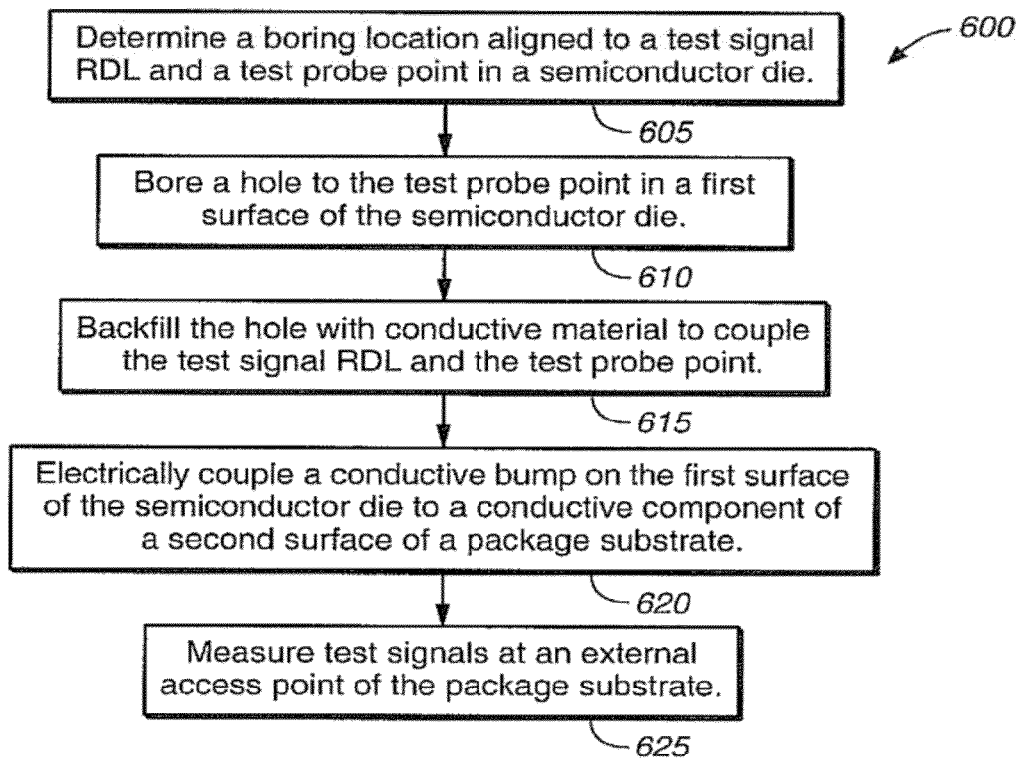
FIG._6

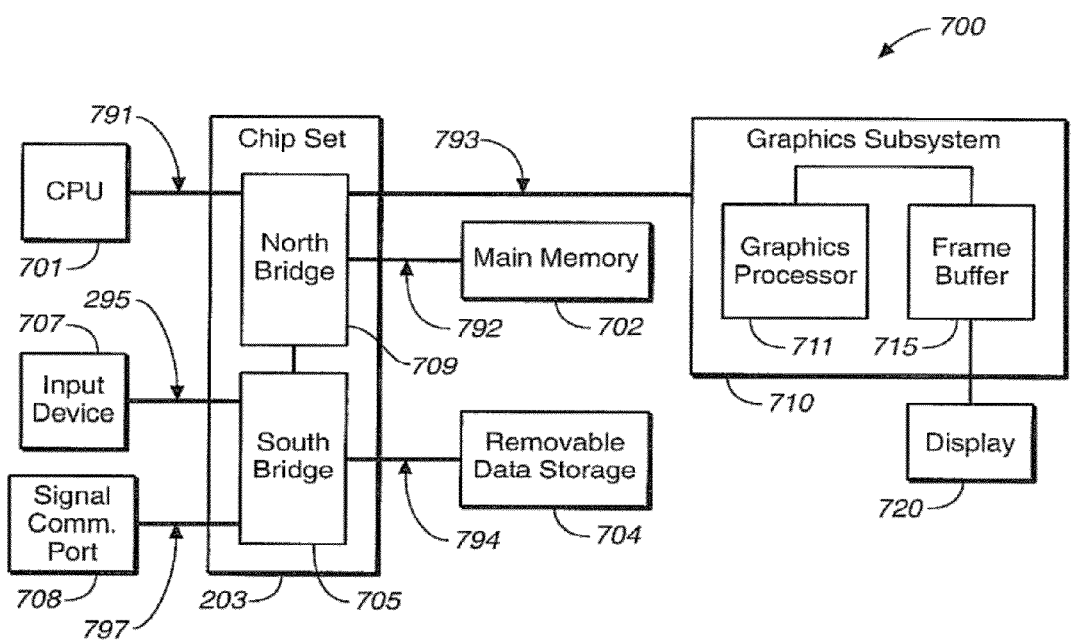
FIG._7

METHOD OF FABRICATING A FLIP CHIP SEMICONDUCTOR DIE WITH INTERNAL SIGNAL ACCESS

RELATED APPLICATIONS

This Application claims the benefit and priority of and is a Continuation of U.S. patent application Ser. No. 12/005,716, entitled "A Flip Chip Semiconductor Die Internal Signal Access System and Method", filed on Dec. 28, 2007, which is a Divisional of U.S. Pat. No. 7,842,948, application Ser. No. 10/789,637, entitled "A Flip Chip Semiconductor Die Internal Signal Access System and Method", filed on Feb. 27, 2004, which are both incorporated herein by this reference.

FIELD OF THE INVENTION

The present invention relates to the field of integrated circuitry. More particularly, embodiments of the present invention provide a device and method for accessing an internal, electrical signal of a semiconductor die.

BACKGROUND OF THE INVENTION

An important component of integrated circuitry design and manufacturing is the testing and troubleshooting of an integrated circuit. Typically testing involves attempts to analyze internal, electrical signals. The analysis of the signals may be used to inspect circuit performance or to perform failure analysis of the integrated circuit.

One class of integrated circuits includes an active region (e.g., transistors) fabricated in a substrate. In particular, the active region resides close to the top surface of the integrated circuit. Traditional attempts to access signals internal to an integrated circuit often involve use of a Focused Ion Beam (FIB) directly from the top of the integrated circuit for accessing the signals. However, conventional attempts at utilizing FIB approaches for flip chips present significant difficulties.

A flip chip is an integrated circuit in which the active area of the chip is "flipped over" facing downward. Instead of facing up and bonded to the package leads with wires from the outside edges of the chip, the surface of the active area of the flip chip can be used for interconnection, which is typically done through metal bumps of solder. These bumps are soldered onto the package substrate or the circuit board itself and underfilled with epoxy. The flip chip allows for a large number of interconnects with shorter distances than wire, which greatly reduces inductance.

For flip chip devices it is inherently difficult to inspect circuit performance or analyze on-die signals for failure due to limited access to the top of the die. The top of the die is mounted to the package substrate such that the active region of the flip chip device is inaccessible from the top. Attempts to access the active region of the flip chip device by drilling through the underside die substrate is difficult. Typically, the die substrate is significantly thicker than the active region of the integrated circuit. For example, a die substrate may be 700 micrometers (μm), while an active region may be closer to 10 μm. To probe a line of the active region of a flip chip, the FIB must drill a sizeable hole through the die substrate. Drilling through the die substrate requires a significantly greater amount of effort, due to the thickness of the die substrate. Furthermore, since a FIB process is typically very expensive to run, drilling through the underside die substrate is also usually very costly. Moreover, the FIB probe point must be placed very accurately, due to the thickness of the die substrate.

SUMMARY OF THE INVENTION

A device and method for accessing internal signals of a flip chip device are presented. In one embodiment, the present invention provides a semiconductor die (e.g., a flip chip die) that includes a test signal redistribution layer (RDL) trace, a test probe point for accessing signals in the semiconductor die and for electrical coupling to the signal RDL, and a conductive test signal bump for transmitting the signals off of the semiconductor die. The test probe point is accessible by drilling a hole into the semiconductor die. In one embodiment, the test probe point is accessible by focused ion beam drilling and conductive material backfill. The conductive material backfill is electrically coupled to the signal RDL.

In one embodiment, conductive traces are disposed in the signal RDL such that multiple test signals are accessible for testing at various electronic component configuration granularity. In one exemplary implementation the conductive traces are routed in a spiral pattern with conductive fingers located in positions such that drilling and conductive material backfill to lower components provides access to varying degrees of signals between components of the semiconductor die.

In one embodiment, the invention provides a semiconductor device including a package substrate for communicating test signals on an external access point and a semiconductor die having test probe points accessible by the external access point, wherein the semiconductor die is electrically coupled to the package substrate. In one exemplary implementation, the package substrate includes a first surface with ball grid array, a second surface with conductive contacts for electrically coupling with conductive bumps of the semiconductor die, including a conductive test signal bump, and a trace for electrically coupling the conductive test signal bump to the conductive contacts to the external access point.

In another embodiment, the invention includes a semiconductor test process. A boring location aligned to a signal RDL and a probe point in a semiconductor die is determined. In one embodiment, the probe point is electrically coupled to a particular signal trace in the semiconductor die. A hole to the probe point is bored in a first surface of the semiconductor die. The hole is backfilled with conductive material to couple the signal RDL and the probe point. In one embodiment, the boring and the backfilling are performed using a FIB.

A conductive test signal bump on the first surface of the semiconductor die is coupled to a conductive component of a second surface of the package substrate, wherein the conductive test signal bump is electrically coupled to the signal RDL. Test signals are measured at an external access point of the package substrate. In one embodiment, the test signal is an internal semiconductor die signal while the semiconductor die is operating. In one embodiment, the measuring is performed by automatic test equipment.

BRIEF DESCRIPTION OF THE DRAWINGS

The accompanying drawings, which are incorporated in and form a part of this specification, illustrate embodiments of the invention and, together with the description, serve to explain the principles of the invention. The drawings referred to in this description should be understood as not being drawn to scale except if specifically noted.

FIG. 1A is a cross-sectional view of a semiconductor die including a test signal redistribution layer (RDL) trace, in accordance with an embodiment of the present invention.

FIG. 1B is a cross-sectional view of a semiconductor die including conductive backfill, in accordance with an embodiment of the present invention.

FIG. 1C is a blown-up cross-sectional view of a semiconductor die including conductive backfill, in accordance with an embodiment of the present invention.

FIG. 2A is a cross-sectional view of a semiconductor package substrate including an external access point, in accordance with an embodiment of the present invention.

FIG. 2B is a cross-sectional view of a flip chip semiconductor device, in accordance with an embodiment of the present invention.

FIG. 3A is a top view of an exemplary signal RDL of a semiconductor device, in accordance with an embodiment of the present invention.

FIG. 3B is an expanded top view of a portion of the exemplary signal RDL of a semiconductor device, in accordance with an embodiment of the present invention.

FIG. 4 is a top view of a conductive trace layer including a test probe point of a semiconductor die, in accordance with an embodiment of the present invention.

FIG. 5 is a flow chart illustrating a semiconductor fabrication process, in accordance with an embodiment of the present invention.

FIG. 6 is a flow chart illustrating a semiconductor test process, in accordance with an embodiment of the present invention.

FIG. 7 is a block diagram of one embodiment of a computer system upon which embodiments of the present invention can be implemented.

DETAILED DESCRIPTION

Reference will now be made in detail to the various embodiments of the invention, examples of which are illustrated in the accompanying drawings. While the invention will be described in conjunction with the various embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

It is appreciated that the present invention can be implemented in a variety of embodiments. In one exemplary implementation, the present invention can be utilized in processing systems that support a variety of graphics applications including video games. For example, the present invention can be utilized in a chip set implementing graphics rendering processes of a game console, personal computer, personal digital assistant, cell phone or any number of platforms for implementing a video game. It is also appreciated that references to video game application implementations are exemplary and the present invention is not limited to these implementations.

FIG. 1A is a cross-sectional view of semiconductor die 160, in accordance with an embodiment of the present invention. Semiconductor die 160 includes die substrate 100, upon which active region 104 is formed. Active region 104 includes the electronic circuitry of semiconductor die 160, including transistors. It should be appreciated that active region 104 may be formed using a variety of semiconductor fabrication techniques, including photolithography.

Semiconductor die 160 further includes conductive trace layers 108 above active region 104. Conductive trace layers 108 include conductive traces (e.g., conductive trace 130) for electrically coupling electronic circuits of active region 104. The conductive traces are used to convey signals between electronic circuits of active region 104. In one embodiment, conductive trace layers 108 include at least one test probe point 136 for accessing signals of the conductive traces. In one embodiment, test probe point 136 is any point on conductive trace 130. In another embodiment, active region 104 includes at least one test probe point. While the detailed description refers to test probe points of conductive trace layers 108, it should be appreciated that embodiments of the invention can include test probe points in active region 104.

Above conductive trace layers 108 is signal redistribution layer (RDL) 112. Signal RDL 112 includes conductive test signal redistribution layer traces 114 that are configured for electrical coupling to the test probe point of conductive trace layers 108. An exemplary signal RDL in accordance with one embodiment of the present invention is described in FIGS. 3A and 3B A plurality of conductive bumps 116 are fabricated above signal RDL 112 for electrically coupling conductive trace layers 108 to conductive traces of a package substrate. The plurality of conductive bumps 116 includes conductive test signal bump 118. Conductive test signal bump 118 is fabricated in signal RDL 112. In one embodiment, conductive test signal bump 118 can be electrically coupled to conductive traces of conductive trace layers 108 through test signal redistribution layer traces 114 of signal RDL 112. For example, conductive test signal bump 118 is electrically coupled to test signal redistribution layer trace 114. It should be appreciated that signal RDL 112 can include any number of test signal redistribution layer traces, and is not limited to the embodiment as shown in FIG. 1A. Test signal redistribution layer trace 114 is configured to be electrically coupled to a test probe point of conductive trace 130, for accessing a test signal (e.g., an internal signal of semiconductor die 160 on conductive trace 130).

FIG. 1B is a cross-sectional view of semiconductor die 160 including conductive backfill 120, in accordance with an embodiment of the present invention. In order to access test probe point 136 of conductive trace 130 in conductive trace layers 108, a hole is bored into semiconductor die 160 down to test probe point 136. In one embodiment, the hole is bored using a Focused Ion Beam (FIB). The hole is backfilled with conductive material, forming conductive backfill 120, forming a test access via. Conductive backfill 120 is electrically coupled to test signal redistribution layer trace 114, which is electrically coupled to conductive test signal bump 118. Signals accessed from a test probe point through conductive backfill 120 are moved off of semiconductor die 160 through conductive test signal bump 118. It should be appreciated that conductive backfill 120 can be electrically coupled to a variety of conductive test signal bumps included in conductive bumps 116 for moving signals off of semiconductor die 160. In one embodiment, test probe point 136 is not grounded.

FIG. 1C is a blown-up cross-sectional view of semiconductor die 160 including conductive backfill, in accordance with an embodiment of the present invention. As shown in FIG. 1C, conductive trace layer 108 include conductive traces 130. In one embodiment, conductive traces 130 are electrically coupled by conductive material in vias 132. Conductive traces 130 are also electrically coupled to electronic circuit components 134 (e.g., transistors) that are included in electronic circuits of active region 104.

Test probe points 136 are electrically coupled to conductive traces 130. It should be appreciated that test probe points 136 may be conductive traces 130. That is, a test signal can be accessed by electrically coupling to a conductive trace 130. In one embodiment, a test probe point 136 is a portion of a conductive trace 130 that is accessible from a first surface (e.g., the "top" surface) of semiconductor die 160, and is unobstructed by other conductive traces. In one embodiment, test probe point 136 is a portion of conductive trace 130 that provides increased surface area for electric coupling (e.g., the trace is widened and/or a FIB pad is added to conductive trace 130).

A hole is bored into semiconductor die 160 down to test probe point 136. The hole is then backfilled with conductive material (e.g., tungsten, platinum, etc.), forming conductive backfill 120. Conductive backfill 120 electrically couples 130 to test signal redistribution layer trace 114, which is electrically coupled to conductive test signal bump 118. Signals accessed from a test probe point through conductive backfill 120 are moved off of semiconductor die 160 through conductive test signal bump 118.

FIG. 2A is a cross-sectional view of a semiconductor package substrate 140 including an external access point 148, in accordance with an embodiment of the present invention. Semiconductor package substrate 140 includes a ball grid array (BGA) 142 on the bottom surface. BGA 142 is accessible for electrically coupling semiconductor package substrate 140 to external devices, including a printed circuit board (PCB).

Semiconductor package substrate 140 further includes conductive trace layer 144, including conductive trace 146. It should be appreciated that conductive trace layer 144 may include any number of conductive traces, and is not limited to the embodiment as shown in FIG. 2A. Conductive trace 146 is electrically coupled to conductive contact 150 and external access point 148. In one embodiment, external access point 148 is accessible by a variety of test related equipment (e.g., automatic test equipment (ATE), oscilloscope, logic analyzer, pico probe, etc.). Conductive contact 150 is configured for electrical coupling to conductive test signal bump 118 of FIGS. 1B and 1C. It should be appreciated that conductive trace layer 144 can also include conductive contacts for electrically coupling to other conductive bumps 116 of FIGS. 1B and 1C.

FIG. 2B is a cross-sectional view of a flip chip semiconductor device 200, in accordance with an embodiment of the present invention. Flip chip semiconductor device 200 includes semiconductor die 160 with conductive backfill 120 of FIG. 1B and semiconductor package substrate 140 of FIG. 2A. Semiconductor die 160 is "flipped over," such that conductive bumps 116, including conductive test signal bump 118, face conductive trace layer 144. In particular, conductive test signal bump 118 is electrically coupled to conductive contact 150. In one embodiment, semiconductor die 160 is fixedly attached to semiconductor package substrate 140. In one embodiment, semiconductor die 160 is fixedly attached to semiconductor package substrate 140 by soldering conductive test signal bump to conductive contact 150 and soldering conductive test signal bumps 116 to other conductive contacts (not shown) of conductive trace layer 144. In one embodiment, the cavity between semiconductor die 160 and semiconductor package substrate 140 is filled with an epoxy.

External access point 148 provides access to a signal from a test probe point of conductive trace layers 108 (e.g., test probe point 136 of FIG. 1C). By forming conductive test trace 114 on semiconductor die 160 and conductive trace 146 on package substrate 140, it is possible to measure the signal without boring a hole through die substrate 100 and active region 104. In another embodiment, conductive contact 150 is electrically coupled to a BGA for accessing a signal from a test probe point.

FIG. 3A is a top view of an exemplary signal RDL 300 of a semiconductor device, in accordance with an embodiment of the present invention. In one embodiment, signal RDL 300 is implemented as signal RDL 112 of FIGS. 1A, 1B, 1C and 2B. Signal RDL 300 includes a plurality of conductive traces, including test signal redistribution layer traces 310. As shown, test signal redistribution layer traces 310 are routed in a spiral pattern. In the shown embodiment, there are ten test signal redistribution layer traces 310. However, it should be appreciated that signal RDL 300 can include any number of test signal redistribution layer traces 310. A conductive trace 310 is electrically coupled to conductive test bump 320. In one embodiment, test signal redistribution layer traces 310 are disposed such that multiple test signals are accessible for testing at various electronic component configuration granularity. For example, a semiconductor die can include a number of individual active components communicatively coupled in a variety of hierarchical configurations to form a number of different functional devices (e.g., memory banks, registers, adders, arithmetic logic units, etc.) By facilitating access to internal signals associated with an individual component level or a "higher" hierarchical functional device level, different degrees of testing granularity can be achieved. For example, testing can be performed at a functional device level (e.g., a adder) by accessing a signal at the input to the adder and a signal at the output. The testing can be performed at a logic component level by accessing a signal at the input and a signal at the output of a logic gate included in the adder. The testing can also be performed at the active component level by accessing a signal at the source and a signal at the drain of a transistor included in the logic gate.

FIG. 3B is an expanded top view 330 of a portion of the exemplary signal RDL 300, in accordance with an embodiment of the present invention. As shown, test signal redistribution layer traces 310 have conductive fingers 340 electrically coupled thereto. In one embodiment, test signal redistribution layer traces 310 and conductive fingers 340 are routed in patterns in which trace widths and spacing between traces are minimized without causing signal interference, thereby providing access to signals over an increased surface area of the semiconductor die. In one embodiment, test signal redistribution layer traces 310 and conductive fingers 340 are located in positions such that drilling and conductive backfill to components and conductive traces provides access to varying degrees of signals between components of the semiconductor die. Signal RDL 300 also includes conductive bumps 350 which can include a conductive test signal bump.

FIG. 4 is a top view of a conductive trace layer 400 including test probe points 420a-c of a semiconductor die, in accordance with one embodiment of the present invention. In one embodiment, conductive trace layer 400 is located beneath a signal RDL. Conductive trace layer 400 includes conductive traces 410a and 410b. Conductive trace 410a is electrically coupled to test probe point 420a and conductive trace 410b is electrically coupled to test probe point 420b.

Conductive trace layer 400 further includes via 430, through which conductive material 440 is applied. In one embodiment, conductive material 440 is electrically coupled to a conductive trace at a lower conductive trace layer. In another embodiment, conductive material 440 is electrically coupled to an electronic component (e.g., a transistor) in the active region of the semiconductor die. Conductive material 440 is also coupled to test probe point 420c.

Test probe points 420a-c are for accessing signals transmitted over conductive trace 410a, conductive trace 410b, and conductive material 440, respectively. In one embodiment, in order to access test probe points 420a-c, a hole is bored into the semiconductor die down to the particular test probe point of test probe points 420a-c, forming a test access via to the signal RDL. In one embodiment, the hole is bored using a FIB. The hole is backfilled with conductive material, forming a conductive backfill.

FIG. 5 is a flow chart illustrating a semiconductor fabrication process 500, in accordance with an embodiment of the present invention. Although specific steps are disclosed in process 500, such steps are exemplary. That is, the embodiments of the present invention are well suited to performing various other steps or variations of the steps recited in FIG. 5. For ease of understanding, process 500 is explained in conjunction with FIG. 1C.

At step 505 of process 500, electronic components are formed on a semiconductor die. In one embodiment, the electronic components are formed in active region 104. It should be appreciated that the electronic components may include any electronic component for use in a semiconductor die, including transistors. It should also be appreciated that the electronic components can be formed using any semiconductor component fabrication technique, including as photolithography.

At step 510, a test pad is formed in the semiconductor die for access by drilling and filling with conductive material backfill. In one embodiment, test probe point 136 is formed, and is electrically coupled to conductive trace 130. It should be appreciated that the test pad can be formed in a conductive trace layer (e.g., conductive trace layers 108) or the active region (e.g., active region 104) and electrically coupled to an electronic component. It should be appreciated that the test pad may be formed using a variety of semiconductor fabrication techniques.

At step 515, a signal RDL including test signal redistribution layer traces is deposited on the semiconductor die. In one embodiment, the conductive traces are disposed such that multiple test signals are accessible for testing at various electronic component configuration granularity, such that different signals associated with individual component, clusters of components, or functional devices can be accessed. In one embodiment, the conductive traces are fabricated in a spiral pattern (e.g., conductive trace 310 of FIG. 3A). In one embodiment, a plurality of conductive fingers (e.g., conductive fingers 340 of FIG. 3B) extending from the conductive traces are fabricated, such that a larger area of said semiconductor die is accessed. It should be appreciated that the signal RDL may be formed using any semiconductor fabrication technique.

At step 530, a conductive test signal bump is fabricated for conveying a signal to an external access point (e.g., an external access test pad) on a package substrate. The conductive test signal bump is located on a first surface of the semiconductor die and is electrically coupled to the signal RDL. In one embodiment, conductive test signal bump 118 as shown in FIG. 1A is electrically coupled to conductive trace 114 of signal RDL 112. In one embodiment, the semiconductor die is a flip chip die configured for connection to the package substrate such that the conductive test signal bump is electrically coupled to a test signal access component of the package substrate, wherein the test signal access component is electrically coupled to the external access point. At step 535, the signal is accessed at the external access point. In one embodiment, the signal is accessed by automatic test equipment, oscilloscope, logic analyzer, pico probe, etc.

FIG. 6 is a flow chart illustrating a semiconductor test process 600, in accordance with an embodiment of the present invention. Although specific steps are disclosed in process 600, such steps are exemplary. That is, the embodiments of the present invention are well suited to performing various other steps or variations of the steps recited in FIG. 6. For ease of understanding, process 500 is explained in conjunction with FIGS. 1C, 2B and 3A.

At step 605 of process 600, a boring location aligned to a test signal redistribution layer traces (e.g., 114 of FIG. 1A or 310 of FIG. 3A) and a test probe point (e.g., 136 of FIG. 1A) in a semiconductor die is determined. In order to electrically couple the test signal redistribution layer traces 114 to a desired test probe point, a boring location over the test probe point is determined. For example, as shown in FIG. 3A, a boring location intersecting a conductive trace is determined. In one embodiment, the test probe point is electrically coupled to a particular signal trace in the semiconductor die. In one embodiment, the signal RDL includes a plurality of test signal redistribution layer traces routed in a spiral pattern. In one embodiment, the signal RDL further includes a plurality of conductive fingers extending from the plurality of test signal redistribution layer traces, such that a larger area of a semiconductor die is accessible. For example, the signal RDL can cover central areas of a die not typically covered by an RDL limited to distributing power and/or ground connections to periphery locations. By covering significant areas of a semiconductor die, a signal RDL in accordance with one embodiment of the present invention can thereby providing access to signals over an increased surface area of the semiconductor die.

At step 610, a hole is bored to the test probe point in a first surface of the semiconductor die. In one embodiment, the hole is bored using a FIB. As shown in FIG. 1C, a hole is bored through signal RDL and intersecting test signal redistribution layer trace 114 down to test probe point 136.

At step 615, the hole is backfilled with conductive material to couple the test signal redistribution layer trace of the signal RDL and the probe point. In one embodiment, the conductive material is backfilled using a FIB. It should be appreciated that any conductive material may be used (e.g., tungsten platinum, etc.).

At step 620, a conductive test signal bump on the first surface of the semiconductor die is electrically coupled to a conductive component of a second surface of the package substrate. The conductive test signal bump is electrically coupled to the test signal redistribution layer trace of signal RDL. As shown in FIG. 2B, the semiconductor die is mounted to package substrate 140 such that conductive test signal bump 118 is electrically coupled to conductive contact 150. Conductive test signal bump 118 is electrically coupled to conductive backfill 120 through test signal redistribution layer trace 114. Conductive contact 150 is electrically coupled to external access point 148 through conductive trace 146.

At step 625, the test signals are measured at an external access point of the package substrate. In one embodiment, the test signals are measured by various test equipment. In one embodiment, the test signal is an internal semiconductor die signal while the semiconductor die is operating.

It is appreciated that a present invention device can be incorporated in a various flip chip components included in different electronic systems. For example, a present invention flip chip device can be included in a variety of electronic systems that process information, including a game console, graphics system, communication system, cell phone, computer system, and personal digital assistant (e.g., PDA).

FIG. 7 is a block diagram of a computer system 700, one embodiment of a computer system upon which embodiments of the present invention can be implemented. Computer system 700 includes central processor unit 701, main memory 702 (e.g., random access memory), chip set 703 with north bridge 709 and south bridge 705, removable data storage device 704, input device 707, signal communications port 708, and graphics subsystem 710 which is coupled to display 720. Computer system 700 includes several busses for communicatively coupling the components of computer system 700. Communication bus 791 (e.g., a front side bus) couples north bridge 709 of chipset 703 to central processor unit 701. Communication bus 792 (e.g., a main memory bus) couples north bridge 709 of chipset 703 to main memory 702. Communication bus 793 (e.g., the Advanced Graphics Port interface) couples north bridge of chipset 703 to graphic subsystem 710. Communication buses 794-797 (e.g., a PCI bus) couple south bridge 705 of chip set 703 to removable data storage device 704, input device 707, and signal communications port 708 respectively. Graphics subsystem 710 includes graphics processor 711 and graphics buffer 715.

The components of computer system 700 cooperatively operate to provide presentations of graphics images. Communications bus 791 through 797 communicate information. Central processor 701 processes information. Main memory 702 stores information and instructions for the central processor 701. Removable data storage device 704 also stores information and instructions (e.g., functioning as a large information reservoir). Input device 706 provides a mechanism for inputting information and/or for pointing to or highlighting information on display 720. Signal communication port 708 provides a communication interface to exterior devices (e.g., an interface with a network). Display device 709 displays information in accordance with data stored in frame buffer 715. Graphics processor 711 processes graphics commands from central processor 701 and provides the resulting data to graphics buffer 715 for storage and retrieval by display monitor 720.

In one embodiment of the present invention, various components of computer system 700 are flip chip devices (e.g., central processor unit 701, main memory 702, components of chip set 703 and components of graphics subsystem 710) in accordance with embodiments of the present invention. In one exemplary implementation, the flip chip devices of computer system 700 include a conductive test signal bump (e.g., 118 of FIG. 1A) for transmitting internal test signals off of said semiconductor die; a test signal redistribution layer trace 114 for communicating the internal test signals to the conductive test signal bump, and a test probe point for accessing test signals in the semiconductor die.

Embodiments of the present invention provide a device and method for accessing internal signals of a flip chip device. By drilling a hole and backfilling the hole with conductive material prior to connecting the semiconductor die to the package substrate, embodiments of the present invention provide a low cost and efficient technique for accessing the internal signals.

Various embodiments of the present invention, a device and method for providing access to a signal of a flip chip semiconductor die, are thus described. While the present invention has been described in particular embodiments, it should be appreciated that the present invention should not be construed as limited by such embodiments, but rather construed according to the below claims.

What is claimed is:

1. A semiconductor fabrication method:
    forming electronic circuits in said semiconductor die;
    forming a test pad in said semiconductor die for access by drilling and conductive material backfill;
    depositing a test signal redistribution layer comprising conductive traces on said semiconductor die, said test signal redistribution layer electrically coupled to said test pad, wherein said depositing said test signal redistribution layer comprises:
    fabricating said conductive traces in a spiral pattern;
    fabricating a plurality of conductive fingers extending from said conductive traces, such that a larger area of said semiconductor die is accessed; and
    fabricating a conductive bump for conveying a signal to an external access point on a package substrate, said conductive bump located on a first surface of said semiconductor die and electrically coupled to said test signal redistribution layer.

2. The method of claim 1 wherein said semiconductor die is a flip chip die configured for connection to said package substrate such that said conductive bump is electrically coupled to a test signal access component of said package substrate, said test signal access component coupled to said external access point.

3. The method of claim 1 wherein said conductive traces are disposed such that multiple test signals are accessible at varying degrees of electronic component granularity.

4. The method as recited in claim 1 further comprising accessing said signal at said external access point.

5. The method of claim 1 wherein said semiconductor die is included in a processing flip chip device configured to process information, wherein said flip chip device includes a test probe point for accessing a semiconductor die internal signal of said processing flip chip through a test signal redistribution layer trace and an external access point on a package substrate;
    a bus configured to communicate information to said processing flip chip device, said bus coupled to said processing flip chip device; and
    a memory configured to store said information, said memory coupled to said bus.

6. The method of claim 5 wherein said package substrate comprises:
    a first surface with a ball grid array;
    a second surface with conductive contacts for electrically coupling with conductive bumps of said semiconductor die, including a conductive test signal bump; and
    a trace for electrically coupling one of said conductive contacts to said external access point.

7. The method of claim 5 wherein said processing flip chip device comprises a semiconductor die comprising:
    a conductive test signal bump configured to transmit internal test signals off of said semiconductor die;
    a test signal redistribution layer trace configured to communicate said internal test signals to said conductive test signal bump, wherein said test signal redistribution trace is included in a redistribution layer, said test signal redistribution layer trace communicatively coupled to said conductive test signal bump;
    a test probe point configured to access internal test signals in said semiconductor die and for electrical coupling to said redistribution layer.

8. The method system of claim 5 wherein said probe point comprises a focused ion beam (FIB) pad accessible by focused ion beam drilling and conductive material backfill.

9. The method of claim 5 wherein said processing flip chip device is for processing game console information.

10. The method of claim 5 wherein said processing flip chip device is for processing graphics information.

11. The method of claim 5 wherein said processing flip chip device is for processing communication information.

12. The method of claim 5 wherein said processing flip chip device is for processing cell phone information.

13. The method of claim 1, wherein forming a test pad further comprises:
   determining a boring location aligned to a test signal redistribution layer and a probe point in a semiconductor die;
   boring a hole to said probe point in a first surface of said semiconductor die; and
   backfilling said hole with conductive material to couple said test signal redistribution layer and said probe point.

14. The method of claim 13, wherein said probe point is electrically coupled to a particular signal trace in said semiconductor die.

15. The method of claim 13, wherein said boring and said backfilling are performed using a focused ion beam (FIB).

16. The method of claim 13, further comprising measuring test signals at said external access point of said package substrate.

17. The method of claim 13, wherein said test signal is an internal semiconductor die signal while said semiconductor die is operating.

\* \* \* \* \*